US012733265B2

(12) United States Patent
Li et al.

(10) Patent No.: US 12,733,265 B2
(45) Date of Patent: Sep. 8, 2026

(54) BACK CONTACT SOLAR CELL, PREPARATION METHOD THEREFOR, AND PHOTOVOLTAIC MODULE

(71) Applicant: LONGI GREEN ENERGY TECHNOLOGY CO., LTD., Xi'an (CN)

(72) Inventors: Zhenguo Li, Xi'an (CN); Fei Luo, Xi'an (CN); Tuan Yuan, Xi'an (CN); Shuai Wu, Xi'an (CN); Jinsheng Zhang, Xi'an (CN); Feng Ye, Xi'an (CN); Liang Fang, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/174,580

(22) Filed: Apr. 9, 2025

(65) Prior Publication Data

US 2025/0241072 A1 Jul. 24, 2025

Related U.S. Application Data

(63) Continuation of application No. PCT/CN2024/103100, filed on Jul. 2, 2024.

(30) Foreign Application Priority Data

Jul. 5, 2023 (CN) ......................... 202310821921.3

(51) Int. Cl.
*H10F 10/14* (2025.01)
*H10F 71/00* (2025.01)
*H10F 77/14* (2025.01)

(52) U.S. Cl.
CPC ......... *H10F 10/146* (2025.01); *H10F 71/121* (2025.01); *H10F 77/147* (2025.01)

(58) Field of Classification Search
CPC ..... H10F 10/146; H10F 77/147; H10F 71/121
See application file for complete search history.

(56) References Cited

U.S. PATENT DOCUMENTS

2024/0347660 A1 10/2024 Li et al.
2024/0395960 A1* 11/2024 Li ......................... H10F 77/219

FOREIGN PATENT DOCUMENTS

CN 113921625 A 1/2022
CN 115588698 A * 1/2023 ........... H10F 71/129
(Continued)

OTHER PUBLICATIONS

Zhang et al., CN 115588698 A, English Machine Translation. (Year: 2023).*

(Continued)

*Primary Examiner* — Tae-Sik Kang
(74) *Attorney, Agent, or Firm* — Fish & Richardson P.C.

(57) ABSTRACT

Implementations relating to a back contact solar cell and its preparation method are provided in this disclosure. In an implementation, a back contact solar cell includes a silicon substrate having a first surface. The first surface comprises a first conductive region, a second conductive region, and an insulation region located between the first conductive region and the second conductive region. The back contact solar cell further comprises a first transport layer located on the first conductive region and a second transport layer located on the second conductive region. The second transport layer extends from the second conductive region through the insulation region to the first conductive region, and partially covers the first transport layer, wherein a thickness of a first portion of the second transport layer located on the insulation region is greater than a thickness of a second portion of the second transport layer located on the second conductive region.

11 Claims, 3 Drawing Sheets

(56) References Cited

FOREIGN PATENT DOCUMENTS

| | | | | |
|---|---|---|---|---|
| CN | 115832065 | A | 3/2023 | |
| CN | 218957742 | U | 5/2023 | |
| WO | 2023/050823 | A1 | 4/2023 | |
| WO | WO-2023050824 | A1 * | 4/2023 | ........... H10F 77/703 |

OTHER PUBLICATIONS

International Search Report and Written Opinion in International Appln. No. PCT/CN2024/103100, mailed on Oct. 9, 2024, 11 pages (with English translation).
Office Action in Australian Appln. No. 2024289730, mailed on May 20, 2025, 3 pages.

* cited by examiner

BACK CONTACT SOLAR CELL, PREPARATION METHOD THEREFOR, AND PHOTOVOLTAIC MODULE

CROSS-REFERENCE TO RELATED APPLICATIONS

The present application is a continuation application of PCT Application No. PCT/2024/103100, filed on Jul. 2, 2024, which claims priority to Chinese Patent Application No. 202310821921.3, filed on Jul. 5, 2023. The disclosures of the aforementioned applications are hereby incorporated by reference in their entireties.

TECHNICAL FIELD

The present application relates to the field of photovoltaic technologies, and in particular, to a back contact solar cell, a preparation method therefor, and a photovoltaic module.

BACKGROUND

A solar cell is a device directly converting light energy into electric energy. After decades of development, currently, crystalline silicon solar cells have an absolute advantage in the photovoltaic cell market, mainly due to their advantages such as a wide range of sources of raw materials, high reliability, high power generation efficiency, and low costs. Currently, the crystal silicon solar cell includes various types such as a passivated emitter and rear contact (PERC) solar cell, a tunnel oxide passivated contact (TOPcon) solar cell, and a heterojunction (HJT) solar cell. Crystalline silicon-amorphous silicon HJT solar cells have gradually become one of the mainstream technologies of crystalline silicon solar cells due to their advantages such as a symmetrical structure, a high open-circuit voltage, a low process temperature, and a good temperature characteristic, and are highly concerned by the industry and academia. Currently, photoelectric conversion efficiency of a large-area solar cell device certified by the industry and academia has reached 26.3%. In addition, the efficiency of the TOPcon solar cell also reaches 25.7%. Similarly, the TOPcon solar cell also has an advantage of low costs. The HJT and TOPcon solar cells still have some problems. A light-entering surface of the solar cell is shaded by grid lines, resulting in reduced absorption of sunlight by the solar cell. Therefore, a short-circuit current loss of the solar cell is large. This is also a problem that almost all silicon-based solar cells currently face. Therefore, research on solar cells having no electrode on a light-entering surface is particularly important. Starting from this, an interdigitated back contact (IBC) solar cell can resolve this problem because electrodes of the IBC solar cell are arranged on a back surface of the IBC solar cell, a short-circuit current loss caused by an upper surface can be reduced. However, a heterojunction back contact (HBC) technology integrating the IBC technology and the HJT technology further reduces metal recombination on a back surface of an IBC solar cell. In terms of a solar cell structure, the HBC solar cell has the following advantages: (1) A PN junction, a substrate, and a contact electrode of an emitting region are all located on a back surface of the HBC solar cell, and a front surface of the HBC solar cell is not shaded by a metal electrode. Therefore, the HBC solar cell has a higher short-circuit current density. (2) Since there is no need to consider a contact resistance problem of the HBC solar cell for the front surface, a front surface field and surface passivation can be designed optimally, to raise an open-circuit voltage of the HBC solar cell. (3) Since positive and negative electrodes are both on the back surface of the IBC solar cell, a wider metal grid line can be used to reduce series resistance (Rs), thereby raising a fill factor (FF). A core problem of the HBC solar cell is how to prepare, on the back surface of the HBC solar cell, high-quality p-regions and n-regions arranged at intervals in an interdigitated manner.

SUMMARY

The present application provides a back contact solar cell, a preparation method therefor, and a photovoltaic module, to resolve a problem that poor integrity of a second transport layer in an existing back contact solar cell affects various performance of the back contact solar cell.

According to a first aspect of the present application, a back contact solar cell is provided, including:

- a silicon substrate, having a first surface, where the first surface includes a first conductive region, a second conductive region, and an insulation region located between the first conductive region and the second conductive region, where the second conductive region has a textured structure;
- a first transport layer, located on the first conductive region;
- a barrier layer, located on an end region of the first transport layer close to the insulation region; and
- a second transport layer, located on the barrier layer, the insulation region, and the second conductive region, where the second transport layer includes a first portion located on the insulation region and a second portion located on the second conductive region, where a thickness of the first portion is greater than a thickness of the second portion, where
- the barrier layer includes a second surface away from the silicon substrate and a first side surface connected to the second surface and close to the insulation region, where the first side surface extends toward the insulation region from a first end close to the second surface to a second end close to the insulation region.

In this embodiment of the present application, the first transport layer is located on the first conductive region. The barrier layer is located on the end region of the first transport layer close to the insulation region. The second transport layer is located on the barrier layer, the insulation region, and the second conductive region. The barrier layer includes the second surface away from the silicon substrate and the first side surface connected to the second surface and close to the insulation region. The first side surface extends toward the insulation region from the first end close to the second surface to the second end close to the insulation region. That is, the first side surface does not have a portion that is concave toward the first conductive region, so that the first side surface facilitates deposition of the second transport layer, and in particular, facilitates deposition of a portion of the second transport layer located on the first side surface. The formed second transport layer has better shape integrity, thereby improving various performance of the back contact solar cell. The second conductive region has a textured structure, and other surfaces on which the second transport layer is formed each have a non-textured structure. The textured structure has a larger specific surface area. Therefore, under the same deposition condition, in the second transport layer, the thickness of the first portion located on the insulation region is greater than the thickness of the second portion located on the second conductive region. In addition, the first portion of the second transport layer located on the insulation region further has specific passivation performance and insulation performance. The thickness of the first portion is greater than the thickness of the second portion, which can improve the passivation performance and insulation performance of the back contact solar cell.

Optionally, the first side surface is planar, or the first side surface is formed by a plurality of sub-regions, and angles between adjacent sub-regions are all less than or equal to 5°.

Optionally, a first angle between the first side surface and the first conductive region is an acute angle.

Optionally, the first side surface is a curved surface that is convex toward the second portion away from the first conductive region.

Optionally, the second transport layer further includes a third portion covering the first side surface and extending to an end portion close to the first portion, where the third portion is in a shape of a continuous gradual slope.

Optionally, the first portion is formed by a first sub-portion and a second sub-portion that are continuous, where the second sub-portion is connected to the second portion, and the third portion, the first sub-portion, and the second sub-portion are sequentially connected to form a step shape; and a second angle between a surface of the first sub-portion away from the silicon substrate and the first conductive region is less than a third angle between a surface of the third portion away from the silicon substrate and the first conductive region, and the second angle is less than a fourth angle between a surface of the second sub-portion away from the silicon substrate and the first conductive region.

Optionally, the first portion is in a shape of a continuous gradual slope.

Optionally, the thickness of the first portion is 1.2 to 2 times the thickness of the second portion.

Optionally, the second transport layer includes a back surface passivation layer and a doped layer that are sequentially stacked, where the back surface passivation layer is closer to the silicon substrate than the doped layer; and a thickness of the back surface passivation layer in the first portion is 1.2 to 2 times a thickness of the back surface passivation layer in the second portion.

Optionally, a material of the barrier layer is selected from silicon nitride or silicon oxide.

Optionally, the barrier layer is single-layer structured; and a refractive index of the barrier layer decreases along a direction from being close to the silicon substrate to being away from the silicon substrate; or refractive indexes at positions in the barrier layer are equal.

Optionally, the barrier layer is multi-layer structured, and etching rates of layer structures increase along a direction from being close to the silicon substrate to being away from the silicon substrate.

Optionally, the barrier layer is multi-layer structured, and refractive indexes of layer structures decrease along a direction from being close to the silicon substrate to being away from the silicon substrate.

Optionally, the first end is farther away from the first conductive region than the second end; and a height difference between the first end and the second end along a thickness direction of the silicon substrate ranges from 30 nanometers to 200 nanometers.

Optionally, a dimension of the first sub-portion in a direction parallel to the first conductive region and along a distribution direction of the first conductive region and the insulation region is less than or equal to 10 micrometers.

Optionally, the silicon substrate has a third surface opposite to the first surface, where the third surface has a textured structure; and the first conductive region and the insulation region each have a polished surface structure.

Optionally, the silicon substrate has a third surface opposite to the first surface; the first transport layer includes a back surface passivation layer and a doped layer that are sequentially stacked, where the back surface passivation layer is closer to the silicon substrate than the doped layer; and the back contact solar cell further includes:

a transparent conductive layer, located on the second transport layer and the exposed first transport layer;

a first electrode, located on the transparent conductive layer and at a position corresponding to the first conductive region and outside the barrier layer;

a second electrode, located on the transparent conductive layer and at a position corresponding to the second conductive region; and a front surface passivation layer and a front surface anti-reflection layer sequentially stacked on the third surface.

According to a second aspect of the present application, a preparation method for the back contact solar cell according to any one of the foregoing is provided, including:

step S1: providing a conductive matrix, where the conductive matrix includes a silicon substrate, having a first surface, where the first surface includes a first conductive region, a second conductive region, and an insulation region located between the first conductive region and the second conductive region, where a first transport layer, a barrier layer, and a mask layer that are sequentially stacked on the first surface, where the barrier layer is single-layer structured, and an etching rate of the barrier layer increases along a direction from being close to the silicon substrate to being away from the silicon substrate; or the barrier layer is multi-layer structured, and etching rates of layer structures increase along a direction from being close to the silicon substrate to being away from the silicon substrate;

step S2: removing the mask layer located on the second conductive region and located on the insulation region, and removing the barrier layer located on the second conductive region, to cause the first transport layer located on the second conductive region to be exposed and at least a partial thickness of the barrier layer to still remain on the insulation region;

step S3: removing the first transport layer exposed on the second conductive region, to expose the second conductive region, and texturing the second conductive region when the at least a partial thickness of the barrier layer protects the insulation region and the remaining mask layer protects the barrier layer on the first conductive region;

step S4: removing the mask layer on the first conductive region close to the end region of the insulation region, to expose the barrier layer below the mask layer, wet-etching away the at least a partial thickness of the barrier layer on the insulation region to expose the insulation region, and wet-etching the exposed barrier layer on the first conductive region close to the end region of the insulation region, to cause the barrier layer on the first conductive region close to the end region of the insulation region to include a second surface away from the silicon substrate and a first side surface connected to the second surface and close to the insulation region, where the first side surface extends toward the insulation region from a first end close to the second surface to a second end close to the insulation region; and step S5: depositing a second transport layer on the barrier layer, the insulation region, and the second conductive region.

Optionally, the barrier layer is single-layer structured, and a refractive index of the barrier layer decreases along the direction from being close to the silicon substrate to being away from the silicon substrate; or the barrier layer is multi-layer structured, and refractive indexes of layer structures decrease along the direction from being close to the silicon substrate to being away from the silicon substrate.

Optionally, a material of the barrier layer is selected from silicon nitride, and the step S1 includes:

preparing the multi-layer structured barrier layer, where in a process of preparing the layer structures, a flow rate of a nitrogen element-containing gas increases sequentially along the direction from being close to the silicon substrate to being away from the silicon substrate; or preparing the single-layer structured barrier layer, where in a process of preparing the barrier layer, a flow rate of a nitrogen element-containing gas increases sequentially.

Optionally, the preparing the multi-layer structured barrier layer includes:

preparing a first layer structure close to the first transport layer, where a thickness of the first layer structure ranges from 10 nm to 50 nm, and a refractive index of the first layer structure ranges from 2.1 to 2.7;

preparing a second layer structure located on the first layer structure, where a thickness of the second layer structure ranges from 10 nm to 50 nm, and a refractive index of the second layer structure ranges from 1.9 to 2.5; and preparing a third layer structure located on the second layer structure, where a thickness of the third layer structure ranges from 10 nm to 50 nm, and a refractive index of the third layer structure ranges from 1.7 to 2.3, where the refractive indexes of the first layer structure, the second layer structure, and the third layer structure decrease sequentially; and the preparing the single-layer structured barrier layer includes:

in a process of preparing a single-layer structure, a flow rate of introduced nitrogen gas ranges from 50 SCCM to 300 SCCM, and the flow rate of the introduced nitrogen gas increases sequentially; or in a process of preparing a single-layer structure, a flow rate of introduced ammonia gas ranges from 50 SCCM to 400 SCCM, and the flow rate of the introduced ammonia gas increases sequentially.

Optionally, a material of the barrier layer is selected from silicon oxide, and the step S1 includes:

depositing the multi-layer structured barrier layer, where deposition rates of the layer structures increase along the direction from being close to the silicon substrate to being away from the silicon substrate; or depositing the single-layer structured barrier layer, where in a process of depositing the barrier layer, a deposition rate increases.

Optionally, the step S4 includes: first removing the mask layer on the first conductive region close to the end region of the insulation region, to expose the barrier layer below the mask layer; and then performing wet-etching on both the at least a partial thickness of the barrier layer on the insulation region and the barrier layer exposed on the first conductive region close to the end region of the insulation region, to etch way the at least a partial thickness of the barrier layer on the insulation region to expose the insulation region, and cause the barrier layer on the first conductive region close to the end region of the insulation region to include a second surface away from the silicon substrate and a first side surface connected to the second surface and close to the insulation region, where the first side surface extends toward the insulation region from a first end close to the second surface to a second end close to the insulation region; or the step S4 includes: first performing wet-etching on the at least a partial thickness of the barrier layer on the insulation region to etch away the at least a partial thickness of the barrier layer on the insulation region, to expose the insulation region; and then, removing the mask layer on the first conductive region close to the end region of the insulation region, to expose the barrier layer below the mask layer, performing wet-etching on the exposed barrier layer on the first conductive region close to the end region of the insulation region, to cause the barrier layer on the first conductive region close to the end region of the insulation region to include a second surface away from the silicon substrate and a first side surface connected to the second surface and close to the insulation region, where the first side surface extends toward the insulation region from a first end close to the second surface to a second end close to the insulation region.

Optionally, the step S2 includes:

removing, by using a laser, the mask layer located on the second conductive region and the barrier layer located below the mask layer, to expose the first transport layer located on the second conductive region, and at the same time, ablating, by a heat affected zone at an edge of a spot of the laser, the mask layer located on the insulation region or the mask layer located on the insulation region and a partial thickness of the barrier layer below the mask layer, to cause the at least a partial thickness of the barrier layer to still remain on the insulation region.

Optionally, in the step S4, an etching solution for the wet-etching includes hydrofluoric acid or phosphoric acid.

According to a third aspect of the present application, a photovoltaic module is provided, including a plurality of back contact solar cells according to any one of the foregoing.

The foregoing back contact solar cell, the foregoing preparation method for the back contact solar cell, and the photovoltaic module all have the same or similar beneficial effects. To avoid repetition, details are not described herein again.

BRIEF DESCRIPTION OF THE DRAWINGS

To describe the technical solutions in embodiments of the present application more clearly, the following briefly describes the accompanying drawings required for describing the embodiments of the present application. Apparently, the accompanying drawings in the following description show merely some embodiments of the present application, and a person of ordinary skill in the art may still derive other accompanying drawings from these accompanying drawings without creative efforts.

DESCRIPTION OF REFERENCE SIGNS

1—silicon substrate, 2—first transport layer, 21—back surface passivation layer of the first transport layer, 22—doped layer of the first transport layer, 3—barrier layer, 31—second surface, 32—first side surface, 4—second transport layer, 41—back surface passivation layer of the second transport layer, 42—doped layer of the second transport layer, 5—transparent conductive layer, 6—first electrode, 7—second electrode.

DETAILED DESCRIPTION

The following clearly and completely describes the technical solutions in the embodiments of the present application with reference to the accompanying drawings in the embodiments of the present application. Apparently, the described embodiments are some rather than all of the embodiments of the present application. All other embodiments obtained by a person of ordinary skill in the art based on the embodiments of the present application without creative efforts shall fall within the protection scope of the present application.

Figure 1:
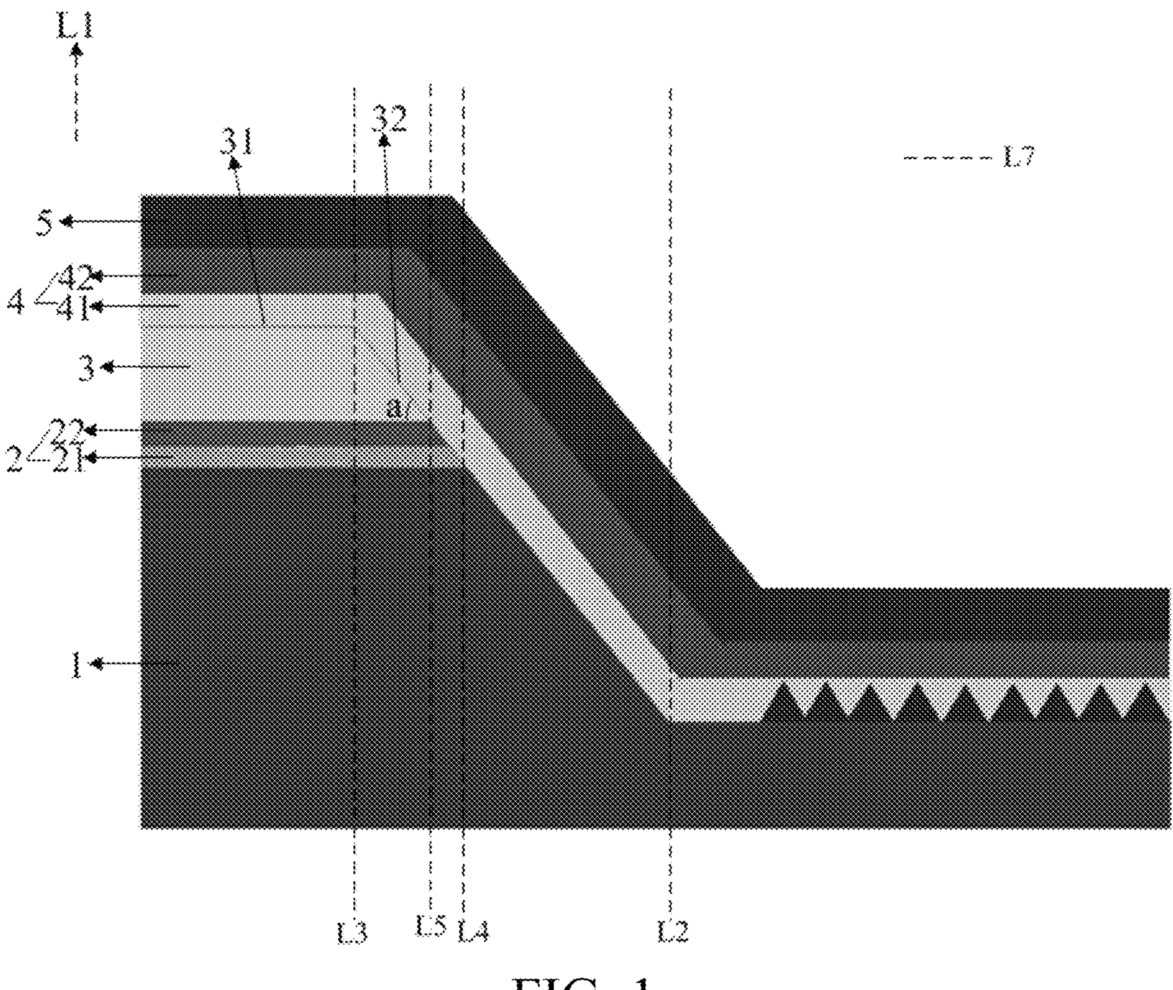
FIG. 1 is a schematic diagram of a partial structure of a back contact solar cell in an embodiment of the present application.
Figure 2:
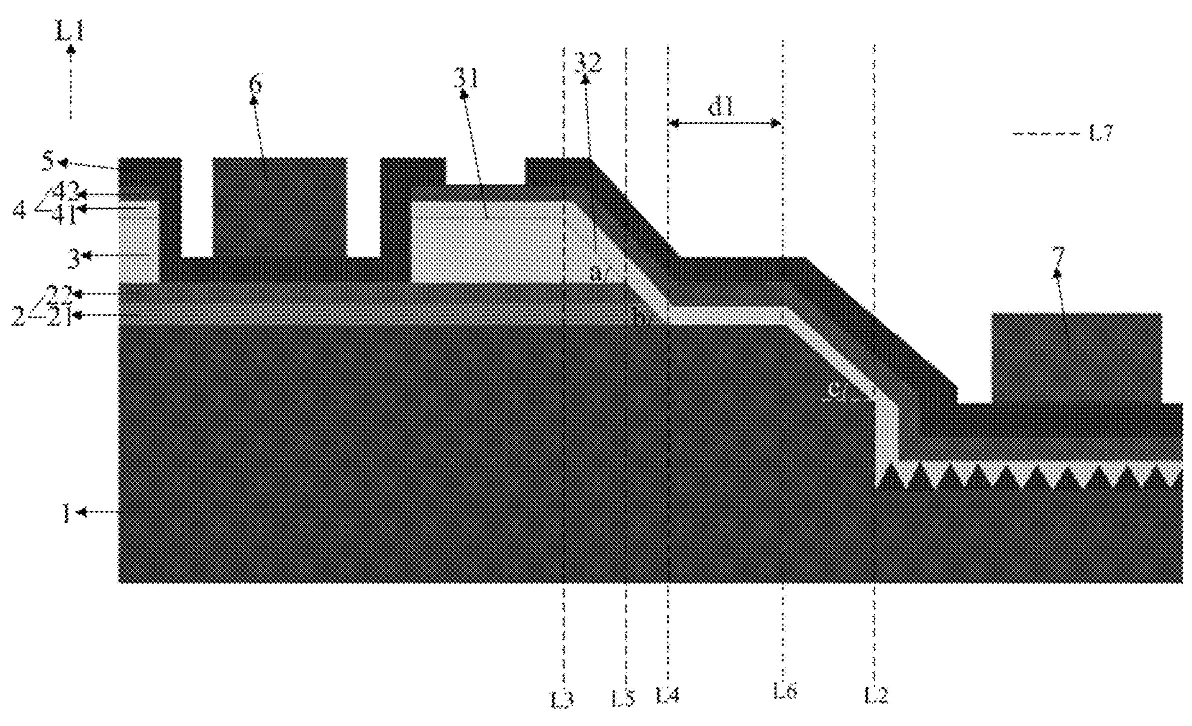
FIG. 2 is a schematic diagram of a partial structure of another back contact solar cell in an embodiment of the present application.
Figure 3:
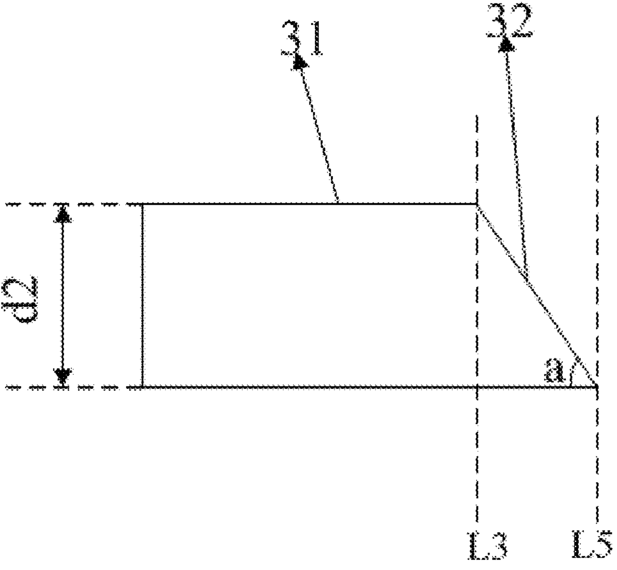
FIG. 3 is a schematic diagram of a partial structure of a barrier layer in an embodiment of the present application.
Figure 4:
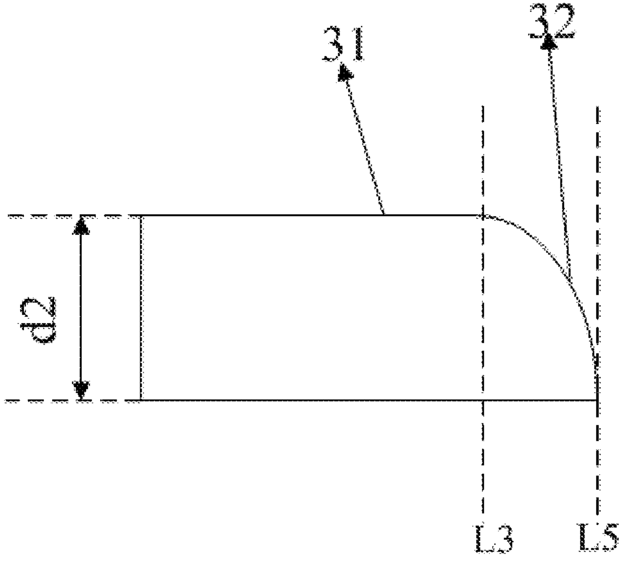
FIG. 4 is a schematic diagram of a partial structure of another barrier layer in an embodiment of the present application.

The present application provides a back contact solar cell. FIG. 1 is a schematic diagram of a partial structure of a back contact solar cell in an embodiment of the present application. FIG. 2 is a schematic diagram of a partial structure of another back contact solar cell in an embodiment of the present application. FIG. 3 is a schematic diagram of a partial structure of a barrier layer in an embodiment of the present application. FIG. 4 is a schematic diagram of a partial structure of another barrier layer in an embodiment of the present application.

Referring to FIG. 1 and FIG. 2, an upper side of a silicon substrate 1 is a first side of the silicon substrate 1, and an upper surface of the silicon substrate 1 is a first surface. The back contact solar cell includes the silicon substrate 1, and the first surface on the first side of the silicon substrate 1 includes a first conductive region, a second conductive region, and an insulation region located between the first conductive region and the second conductive region. As shown in FIG. 1 and FIG. 2, a region located on a left side of a dashed line L4 in the first surface of the silicon substrate 1 is the first conductive region, a region located between the dashed line L4 and a dashed line L2 in the first surface of the silicon substrate 1 is the insulation region, and a region located on a right side of the dashed line L2 in the first surface of the silicon substrate 1 is the second conductive region. It should be noted that the dashed line L2, a dashed line L3, the dashed line L4, a dashed line L5, and a dashed line L6 do not actually exist in the back contact solar cell, and are shown herein merely for representing different regions and the like. The second conductive region has a textured structure, and a size and the like of the textured structure are not specifically limited. That is, the region on the right side of the dashed line L2 in the first surface of the silicon substrate 1 has a textured structure.

A first transport layer 2, a second transport layer 4, and a barrier layer 3 are all located on the first side of the silicon substrate 1. A doping type of the silicon substrate 1 may be N-type doping, P-type doping, or the like, and the doping type of the silicon substrate 1 is not specifically limited. The first side of the silicon substrate 1 is a side of the silicon substrate 1 of the back contact solar cell close to electrodes, and the first surface on the first side of the silicon substrate 1 is a surface of the silicon substrate 1 of the back contact solar cell close to the electrodes. The first transport layer 2 and the second transport layer 4 have different doping types, that is, one of the two is N-type doped, and the other is P-type doped.

As shown in FIG. 1 and FIG. 2, the first transport layer 2 is located on the first conductive region. The barrier layer 3 is located on an end region of the first transport layer 2 close to the insulation region. The second transport layer 4 is located on the barrier layer 3, the insulation region, and the second conductive region.

Referring to FIG. 1 to FIG. 4, the barrier layer 3 includes a second surface 31 away from the silicon substrate 1 and a first side surface 32 connected to the second surface 31 and close to the insulation region. The first side surface 32 extends toward the insulation region from a first end close to the second surface 31 to a second end close to the insulation region. That is, in FIG. 1 to FIG. 4, a position in the first side surface 32 that coincides with the dashed line L3 is a position at which the first end of the first side surface 32 is located, and a position in the first side surface 32 that coincides with the dashed line L5 is a position at which the second end of the first side surface 32 is located. The first side surface 32 does not have a portion that is concave toward the first conductive region, so that the first side surface 32 facilitates deposition of the second transport layer 4, and in particular, facilitates deposition of a portion of the second transport layer 4 located on the first side surface 32. The formed second transport layer 4 has better shape integrity, that is, better conformality, thereby improving various performance of the back contact solar cell.

Referring to FIG. 1 and FIG. 2, the second transport layer 4 includes a first portion located on the insulation region and a second portion located on the second conductive region. A first portion of the second transport layer 4 is a portion of the second transport layer 4 located between the dashed lines L4 and L2, and a portion of the second transport layer 4 located on the right side of the dashed line L2 is a second portion located on the second conductive region. In the second transport layer 4, a thickness of the first portion located on the insulation region is greater than a thickness of the second portion located on the second conductive region. A specific reason is that the second conductive region has a textured structure, and other surfaces on which the second transport layer 4 is formed each have a non-textured structure, for example, may each be a polished surface. The textured structure has a larger specific surface area. Therefore, under the same deposition condition, in the second transport layer 4, the thickness of the first portion located on the insulation region is greater than the thickness of the second portion located on the second conductive region. In addition, in the second transport layer 4, the first portion located on the insulation region further has specific passivation performance and insulation performance. The thickness of the first portion is greater than the thickness of the second portion, which can improve the passivation performance and insulation performance of the back contact solar cell.

It should be noted that, specifically, an amount by which the thickness of the first portion is greater than the thickness of the second portion is determined based on a size of the textured structure of the second conductive region, actual process conditions, and the like.

Optionally, referring to FIG. 3, the first side surface 32 is planar, or the first side surface 32 is formed by a plurality of sub-regions, and angles between adjacent sub-regions are all less than or equal to 5°. The shape of the first side surface 32 is flexibly diversified, and helps prepare the second transport layer 4 with a more complete shape. For example, in the first side surface 32, an angle between adjacent sub-regions may be 5°, 4°, 3°, 2.5°, 2°, 1°, 0.5°, 0.4°, or the like.

Optionally, referring to FIG. 1, FIG. 2, and FIG. 3, when the first side surface 32 is planar, or the first side surface 32 is formed by a plurality of sub-regions, and angles between adjacent sub-regions are all less than or equal to 5°, a first angle a between the first side surface 32 and the first conductive region is an acute angle, that is, the first angle a is greater than 0° and less than 90°. The shape of the first side surface 32 is flexibly diversified, and helps prepare the second transport layer 4 with a more complete shape.

Optionally, referring to FIG. 4, the first side surface 32 is a curved surface that is convex toward the second portion. To be specific, the first side surface 32 formed into a curved surface is obliquely convex away from the first conductive region, so that the first side surface 32 is also convex toward the second portion. The shape of the first side surface 32 is flexibly diversified, and helps prepare the second transport layer 4 with a more complete shape.

Referring to FIG. 1 and FIG. 2, the first portion of the second transport layer 4 is a portion of the second transport layer 4 located between the dashed lines L4 and L2. The second portion of the second transport layer 4 is a portion of the second transport layer 4 located on the right side of the dashed line L2. The second transport layer 4 further includes a third portion covering the first side surface 32 and extending to an end portion close to the first portion. The third portion is a portion of the second transport layer 4 located on a right side of the dashed line L3 and a left side of the dashed line L4.

Optionally, referring to FIG. 1, the third portion is in a shape of a continuous gradual slope. That is, an angle between the third portion and the first conductive region is an acute angle. The shape of the third portion is flexibly diversified, and helps prepare the second transport layer 4 with a more complete shape.

Optionally, referring to FIG. 1, the first portion and the third portion are continuous. The first portion is in a shape of a continuous gradual slope. The shape of the first portion is flexibly diversified, and helps prepare the second transport layer 4 with a more complete shape.

Optionally, referring to FIG. 2, the first portion of the second transport layer 4 includes a first sub-portion of the second transport layer 4 located between the dashed line L4 and the dashed line L6, and a second sub-portion of the second transport layer 4 located between the dashed line L6 and the dashed line L2. The first sub-portion and the second sub-portion are continuous. The third portion of the second transport layer 4 located between the dashed line L3 and the dashed line L4, the first sub-portion of the second transport layer 4 located between the dashed line L4 and the dashed line L6, and the second sub-portion of the second transport layer 4 located between the dashed line L6 and the dashed line L2 are sequentially connected to form a step shape. A second angle between a surface of the first sub-portion of the second transport layer 4 located between the dashed line L4 and the dashed line L6 away from the silicon substrate 1 and the first conductive region is less than a third angle b between a surface of the third portion of the second transport layer 4 located between the dashed line L3 and the dashed line L4 away from the silicon substrate 1 and the first conductive region, and the second angle is less than a fourth angle c between a surface of the second sub-portion of the second transport layer 4 located between the dashed line L6 and the dashed line L2 away from the silicon substrate 1 and the first conductive region. Whether the third angle b between the surface of the third portion away from the silicon substrate 1 and the first conductive region is equal to the fourth angle c between the surface of the second sub-portion away from the silicon substrate 1 and the first conductive region has little impact on shape integrity of the third portion and the two sub-portions, namely, the first sub-portion and the second sub-portion. Compared with that the first portion and the third portion are a continuous structure, that the first portion and the third portion are step-shaped reduces processing difficulty, expands a process window, and improves a product yield. It should be noted that if the third angle b and the fourth angle c are not equal, which of the two is larger or smaller is not limited. The second angle between the surface of the first sub-portion away from the silicon substrate 1 and the first conductive region may be 0° or close to 0°. For example, the second angle in FIG. 2 may be 0°. In another example, the second angle may range from 0° to 10°.

Optionally, referring to FIG. 2, a dimension d1 of the first sub-portion of the first portion located between the dashed line L4 and the dashed line L6 in a direction parallel to the first conductive region and along a distribution direction L7 of the first conductive region and the insulation region is less than or equal to 10 micrometers (μm). That the dimension of the first sub-portion falls within the range greatly contributes to reducing processing difficulty, expanding a process window, and improving a product yield, and leads to easy manufacturing.

For example, in the distribution direction L7, the dimension d1 of the first sub-portion of the first portion located between the dashed line L4 and the dashed line L6 is 0.3 μm, 1 μm, 2 μm, 5 μm, 6 μm, 9 μm, or 10 μm.

Optionally, referring to FIG. 1 and FIG. 2, the first portion of the second transport layer 4 located on the insulation region is a portion of the second transport layer 4 located between the dashed line L4 and the dashed line L2, and the second portion of the second transport layer 4 located on the second conductive region is a portion of the second transport layer 4 located on the right side of the dashed line L2. In the second transport layer 4, a thickness of the first portion located on the insulation region is 1.2 to 2 times a thickness of the second portion located on the second conductive region. That the thicknesses of the two fall within the range facilitates deposition and leads to a wide deposition process window. For example, the thickness of the first portion is 1.2 times, 1.3 times, 1.4 times, 1.5 times, 1.6 times, 1.68 times, 1.7 times, 1.71 times, 1.9 times, or 2 times the thickness of the second portion located on the second conductive region.

Optionally, referring to FIG. 1 and FIG. 2, the second transport layer 4 includes a back surface passivation layer 41 and a doped layer 42 that are sequentially stacked. The back surface passivation layer 41 is closer to the silicon substrate 1 than the doped layer 42. A thickness of the back surface passivation layer 41 in the first portion of the second transport layer 4 is 1.2 to 2 times a thickness of the back surface passivation layer 41 in the second portion of the second transport layer 4. Specifically, the back surface passivation layer 41 in the first portion of the second transport layer 4 located on the insulation region mainly implements a function of preventing formation of an electric leakage channel and a back surface passivation function. The back surface passivation layer 41 in the first portion of the second transport layer 4 located on the insulation region has a larger thickness, thereby greatly reducing a probability of forming an electric leakage channel and improving back surface passivation. Therefore, the photoelectric conversion efficiency of the back contact solar cell can be improved. In addition, the thickness of the back surface passivation layer 41 in the first portion of the second transport layer 4 and the thickness of the back surface passivation layer 41 in the second portion of the second transport layer 4 fall within the range. Because the textured structure of the second conductive region has a larger specific surface area, deposition is easy, and a deposition process window is wide.

For example, the thickness of the back surface passivation layer 41 in the first portion of the second transport layer 4 is 1.2 times, 1.3 times, 1.4 times, 1.5 times, 1.6 times, 1.69 times, 1.7 times, 1.72 times, 1.9 times, or 2 times the thickness of the back surface passivation layer 41 in the second portion of the second transport layer 4.

Optionally, a material of the barrier layer 3 is selected from silicon nitride or silicon oxide. The barrier layer 3 made of the foregoing material easily forms the first side surface 32 in the foregoing shape, and has low costs.

Optionally, the barrier layer 3 is single-layer structured. A refractive index of the barrier layer 3 decreases along the direction L1 from being close to the silicon substrate 1 to being away from the silicon substrate 1. The barrier layer 3 having the foregoing material and structure has the refractive index distributed according to the rule, which makes it particularly easy to form the first side surface 32 in the foregoing shape, and leads to low costs.

Optionally, the barrier layer 3 is single-layer structured. Refractive indexes at positions in the barrier layer 3 are equal. The barrier layer 3 having the foregoing material and structure also makes it particularly easy to form the first side surface 32 in the foregoing shape, and leads to low costs.

Optionally, the barrier layer 3 is multi-layer structured. Refractive indexes of layer structures decrease along the direction L1 from being close to the silicon substrate 1 to being away from the silicon substrate 1. The barrier layer 3 having the foregoing material and structure has the refractive indexes distributed according to the rule, which makes it particularly easy to form the first side surface 32 in the foregoing shape, and leads to low costs. For example, the barrier layer is two-layer structured, and refractive indexes of layer structures decrease along the direction L1. In another example, the barrier layer is three-layer structured, and refractive indexes of layer structures decrease along the direction L1.

Optionally, the barrier layer 3 is multi-layer structured. Etching rates of layer structures increase along the direction L1 from being close to the silicon substrate 1 to being away from the silicon substrate 1. The etching rates are distributed according to the rule, which makes it particularly easy to form the first side surface 32 in the foregoing shape through etching, and leads to low costs.

Optionally, referring to FIG. 3 and FIG. 4, in the first side surface 32 of the barrier layer 3, a first end close to the second surface 31 is further away from the first conductive region than a second end close to the insulation region. A height difference d2 between the first end and the second end in the first side surface 32 along a thickness direction of the silicon substrate 1 ranges from 30 nanometers (nm) to 200 nm. The barrier layer 3 with the foregoing dimension has a better barrier effect and is easy to obtain. Moreover, the first side surface 32 with the foregoing dimension makes it easy to obtain the second transport layer 4 with better shape integrity. The thickness direction of the silicon substrate 1 herein is parallel to the foregoing direction L1 from being close to the silicon substrate 1 to being away from the silicon substrate 1.

For example, the height difference d2 between the first end and the second end in the first side surface 32 along the thickness direction of the silicon substrate 1 is 30 nm, 50 nm, 80 nm, 110 nm, 120 nm, 150 nm, 180 nm, or 200 nm.

Optionally, a third surface on a second side of the silicon substrate 1 has a textured structure, the second side of the silicon substrate 1 is opposite to the first side of the silicon substrate 1, and the third surface is opposite to the first surface. For example, referring to FIG. 1 and FIG. 2, the second side of the silicon substrate 1 is a lower side of the silicon substrate 1. That the third surface on the second side of the silicon substrate 1 has a textured structure can increase a light entrapment effect, and improve the photoelectric conversion efficiency.

Optionally, the first conductive region and the insulation region in the first surface of the silicon substrate 1 each have a polished surface structure. The first conductive region and the insulation region are level, and the level first conductive region makes it easy to manufacture the first transport layer 2 with better quality.

Optionally, the first transport layer 2 includes a back surface passivation layer 21 and a doped layer 22 that are sequentially stacked. The back surface passivation layer 21 is closer to the silicon substrate 1 than the doped layer 22. The doped layer 22 in the first transport layer 2 and the doped layer 42 in the second transport layer 4 have different doping types, that is, one of the two is N-type doped, and the other is P-type doped.

Optionally, a material of the back surface passivation layer 21 of the first transport layer 2 and a material of the back surface passivation layer 41 of the second transport layer 4 are each selected from amorphous silicon, and a material of the doped layer 22 of the first transport layer 2 and a material of the doped layer 42 of the second transport layer 4 are each selected from doped amorphous silicon or doped microcrystalline silicon. That is, the back contact solar cell is a heterogeneous junction back contact (HMC) cell. The HMC cell mainly has the following advantages: First, a PN junction, the silicon substrate 1, and a contact electrode of an emitting region are all located on a back surface of the HBC solar cell, and a front surface of the HBC solar cell is not shaded by a metal electrode. Therefore, the HBC solar cell has a higher short-circuit current density. Second, since there is no need to consider a contact resistance problem of the HBC solar cell for the light-receiving surface, a front surface field and surface passivation can be designed optimally, to raise an open-circuit voltage of the HBC solar cell. Third, since positive and negative electrodes are both on the back surface of the IBC solar cell, a wider metal grid line can be used to reduce series resistance (Rs), thereby increasing a fill factor (FF). The back contact solar cell further has advantages such as a low process temperature and a good temperature characteristic.

Alternatively, optionally, a material of the back surface passivation layer 21 of the first transport layer 2 and a material of the back surface passivation layer 41 of the second transport layer 4 are each selected from silicon oxide, and a material of the doped layer 22 of the first transport layer 2 and a material of the doped layer 42 of the second transport layer 4 are each selected from doped polysilicon. To be specific, the back contact solar cell is a tunnel oxide passivated contact back contact (TBC) cell, and the back contact solar cell also has advantages such as a high open-circuit voltage, a low process temperature, and a good temperature characteristic.

Optionally, referring to FIG. 1 and FIG. 2, the back contact solar cell further includes: a transparent conductive layer 5, a first electrode 6, and a second electrode 7 that are all located on the first side of the silicon substrate 1. The transparent conductive layer 5 is located on the second transport layer and the exposed first transport layer. The first electrode 6 is located on the transparent conductive layer 5 and at a position corresponding to the first conductive region and outside the barrier layer 3, and the second electrode 7 is located on the transparent conductive layer 5 and at a position corresponding to the second conductive region.

The back contact solar cell may further include: a front surface passivation layer and a front surface anti-reflection layer sequentially stacked on the third surface of the silicon substrate 1. The first surfaces and the third surface are oppositely distributed.

The present application further provides a preparation method for a back contact solar cell, including the following steps:

Step S1: Provide a conductive matrix, where the conductive matrix includes a silicon substrate, having a first surface, where the first surface includes a first conductive region, a second conductive region, and an insulation region located between the first conductive region and the second conductive region, where a first transport layer, a barrier layer, and a mask layer that are sequentially stacked on the first surface, where the barrier layer is single-layer structured, and an etching rate of the barrier layer increases along a direction from being close to the silicon substrate to being away from the silicon substrate; or the barrier layer is multi-layer structured, and etching rates of layer structures increase along a direction from being close to the silicon substrate to being away from the silicon substrate; a portion of the barrier layer located on the second conductive region is broken to expose the first transport layer on the second conductive region.

The silicon substrate 1 may be wet cleaned in advance, to remove a cutting damage layer, impurity particles, metal, organic matter, moisture molecules, a natural oxide film, and the like.

The step S1 may be: preparing a back surface passivation layer 21 and a back surface doped layer 22 of the first transport layer 2 on a first side of a silicon substrate 1 through low pressure chemical vapor deposition (LPCVD) or plasma enhanced chemical vapor deposition (PECVD), and simultaneously, depositing a barrier layer 3 on the first transport layer 2. A thickness of the back surface passivation layer 21 ranges from 3 nm to 15 nm, for example, may range from 5 to 8 nm. A thickness of the back surface doped layer 22 ranges from 5 nm to 25 nm, for example, may range from 10 nm to 15 nm. Then, a mask layer is disposed on the barrier layer 3. The mask layer may be an acid-resistant and alkali-resistant mask layer. For example, a material of the mask layer may be selected from polyurethane and the like, and a specific material of the mask layer is not limited.

Optionally, the barrier layer 3 is single-layer structured, and a refractive index of the barrier layer 3 decreases along the direction from being close to the silicon substrate 1 to being away from the silicon substrate 1. Alternatively, the barrier layer 3 is multi-layer structured, and refractive indexes of layer structures decrease along the direction from being close to the silicon substrate 1 to being away from the silicon substrate 1. A larger refractive index of the barrier layer 3 indicates a lower etching rate. The refractive index of the foregoing barrier layer 3 is set according to the rule, which makes it easy to obtain the foregoing first side surface 32.

Optionally, the barrier layer 3 may be multi-layer structured or single-layer structured. A material of the barrier layer 3 is selected from silicon nitride (SiNx). A single-layer structured barrier layer is prepared. In a process of preparing the barrier layer, a flow rate of a nitrogen element-containing gas increases sequentially. In this way, a barrier layer 3 having a refractive index decreased or an etching rate increased along a direction L1 from being close to the silicon substrate 1 to being away from the silicon substrate can be simply prepared. A degree by which the flow rate of the nitrogen element-containing gas is increased is not specifically limited.

Optionally, the barrier layer 3 is multi-layer structured. A material of the barrier layer 3 is selected from silicon nitride (SiNx). A multi-layer structured barrier layer is prepared. In a process of preparing layer structures, a flow rate of a nitrogen element-containing gas increases sequentially along a direction L1 from being close to the silicon substrate 1 to being away from the silicon substrate 1. In this way, a barrier layer having refractive indexes of layer structures decreased or etching rates of layer structures increased along the direction L1 from being close to the silicon substrate 1 to being away from the silicon substrate can be simply prepared. In a process of preparing the layer structures, a degree by which the flow rate of the nitrogen element-containing gas is increased is not specifically limited.

Optionally, the barrier layer 3 is multi-layer structured. A material of the barrier layer 3 is selected from silicon nitride (SiNx). The preparing the multi-layer structured barrier layer 3 may include: preparing a first layer structure close to the silicon substrate 1, where a thickness of the first layer structure ranges from 10 nm to 50, for example, may range from 15 nm to 40 nm, and a refractive index of the first layer structure is 2.4±0.3, for example, may range from 2.5 to 2.6; preparing a second layer structure located on the first layer structure, where a thickness of the second layer structure ranges from 10 nm to 50 nm, for example, may range from 15 nm to 40 nm, and an refractive index of the second layer structure is 2.2±0.3, for example, may range from 2.3 to 2.4; and preparing a third layer structure located on the second layer structure, where a thickness of the third layer structure may range from 10 nm to 50 nm, for example, may range from 15 nm to 40 nm, and an refractive index of the third layer structure is 2.0±0.3, for example, may range from 2.1 to 2.2.

Alternatively, optionally, the barrier layer 3 is single-layer structured. A material of the barrier layer 3 is selected from silicon nitride (SiNx). In a process of preparing a single-layer structure, a flow rate of introduced nitrogen gas ranges from 50 standard cubic centimeters per minute (SCCM) to 300 SCCM, and the flow rate of the introduced nitrogen gas increases sequentially. Alternatively, in a process of preparing a single-layer structure, a flow rate of introduced ammonia gas ranges from 50 SCCM to 400 SCCM, and the flow rate of the introduced ammonia gas increases sequentially. In this way, a single-layer structured barrier layer having a refractive index decreased or an etching rate increased along the direction L1 from being close to the silicon substrate 1 to being away from the silicon substrate can be simply prepared. For example, during deposition of silicon nitride, a flux of N2 or H3 is gradually increased, to form a single-layer structured silicon nitride film layer having a refractive index gradually decreased or an etching rate gradually increased. A thickness of the single-layer structured silicon nitride film layer ranges from 20 nm to 200 nm, for example, the thickness ranges from 30 nm to 90 nm, and a flow rate of N2 or NH3 is also gradually increased.

Optionally, a material of the barrier layer 3 is selected from silicon oxide (SiOx). The foregoing step S1 may include: depositing the multi-layer structured barrier layer 3, where deposition rates of the layer structures increase along the direction L1 from being close to the silicon substrate 1 to being away from the silicon substrate 1. A higher deposition rate indicates a lower density, a lower refractive index, and a higher etching rate of the formed silicon oxide. Therefore, a barrier layer 3 having refractive indexes of layer structures decreased along the direction L1 from being close to the silicon substrate 1 to being away from the silicon substrate 1 can be obtained.

Alternatively, optionally, a material of the barrier layer 3 is selected from silicon oxide (SiOx). The foregoing step S1 may include: depositing the single-layer structured barrier layer 3, where during deposition of the barrier layer 3, a deposition rate is increased. A higher deposition rate indicates a lower density, a lower refractive index, and a higher etching rate of the formed silicon oxide. Therefore, a barrier layer 3 having a refractive index decreased or an etching rate increased along the direction L1 from being close to the silicon substrate 1 to being away from the silicon substrate 1 can be obtained.

Step S2: Remove the mask layer located on the second conductive region and located on the insulation region, and remove the barrier layer located on the second conductive region, to cause the first transport layer located on the second conductive region to be exposed and at least a partial thickness of the barrier layer to still remain on the insulation region.

The mask layer located on the second conductive region and located on the insulation region can be removed by using a laser, a special etching agent, or the like, and the barrier layer 3 located on the second conductive region is removed, to cause the first transport layer located on the second conductive region to be exposed and the at least a partial thickness of the barrier layer 3 to still remain on the insulation region.

Optionally, the step S2 may include: removing, by using a laser, the mask layer located on the second conductive region and the barrier layer 3 located below the mask layer, to expose the first transport layer located on the second conductive region. By adjusting the laser, a heat affected zone is formed at an edge of a spot of the laser. While the laser removes the mask layer located on the second conductive region and the barrier layer 3 located below the mask layer, the heat affected zone at the edge of the spot of the laser ablates the mask layer located on the insulation region or the mask layer located on the insulation region and a partial thickness of the barrier layer 3 below the mask layer, to cause at least a partial thickness of the barrier layer 3 to still remain on the insulation region. That is to say, the heat affected zone at the edge of the spot of the laser may ablate only the mask layer on the insulation region or the heat affected zone at the edge of the spot of the laser may ablate the mask layer on the insulation region and a partial thickness of the barrier layer 3 below the mask layer, which depends on energy of the heat affected zone at the edge of the spot of the laser. When the energy of the heat affected zone at the edge of the spot of the laser is large, the heat affected zone at the edge of the spot of the laser can ablate the mask layer on the insulation region and the partial thickness of the barrier layer 3 below the mask layer. When the energy of the heat affected zone at the edge of the spot of the laser is small, the heat affected zone at the edge of the spot of the laser can ablate only the mask layer on the insulation region.

It should be noted that after patterning is completed by using a laser, if there is a little residue of the barrier layer 3 on the second conductive region, the barrier layer 3 that may remain on the second conductive region after the patterning may be cleaned by using hydrofluoric acid or phosphoric acid. The hydrofluoric acid may be at room temperature, and the phosphoric acid may be at a temperature greater than or equal to 158° C. Because the barrier layer on the second conductive region has been etched by the spot of the laser, the barrier layer 3 that possibly remains on the second conductive region has a small amount or is thin. Even if the heat affected zone at the edge of the spot of the laser ablates the mask layer on the insulation region and a partial thickness of the barrier layer 3 below the mask layer, the energy of the heat affected zone at the edge of the spot of the laser is far less than the energy of the spot of the laser. Therefore, the thickness of the barrier layer 3 remaining on the insulation region is far greater than the thickness of the barrier layer 3 possibly remaining on the second conductive region. By controlling a cleaning time and the like, the barrier layer 3 possibly remaining on the second conductive region is completely cleaned, and the first transport layer on the second conductive region is exposed. However, a partial thickness of the barrier layer 3 still remains on the insulation region. In the cleaning process, due to protection by the mask layer, the barrier layer 3 on the first transport layer on the first conductive region basically not affected.

It should be noted that when an area of the heat affected zone at the edge of the spot of the laser is large, the structure of the first portion shown in FIG. 2 can be formed. That is, in the formed first portion, a second angle between a surface of the first sub-portion away from the silicon substrate 1 and the first conductive region is less than a third angle b between a surface of the third portion away from the silicon substrate 1 and the first conductive region, and the second angle is less than a fourth angle c between a surface of the second sub-portion away from the silicon substrate 1 and the first conductive region. In addition, the third portion, the first sub-portion, and the second sub-portion are sequentially connected to form a step shape. When the area of the heat affected zone at the edge of the spot of the laser is small, the structure of the first portion shown in FIG. 1 can be formed. That is, the first portion is in a shape of a continuous gradual slope, and the first portion and the third portion are continuous and form a gradual slope.

Step S3: Remove the first transport layer exposed on the second conductive region, to expose the second conductive region, and texture the second conductive region when the at least a partial thickness of the barrier layer protects the insulation region and the remaining mask layer protects the barrier layer on the first conductive region.

The first transport layer exposed on the second conductive region may be removed by using a texturing liquid for texturing, to expose the second conductive region and texture the second conductive region. During texturing, at least a partial thickness of the barrier layer located on the insulation region protects the insulation region, and the remaining mask layer protects the barrier layer on the first conductive region. For example, the texturing liquid is an alkaline texturing liquid, and the barrier layer is made of silicon nitride and/or silicon oxide. The alkaline texturing liquid basically does not damage the barrier layer. The mask layer is acid-resistant and alkali-resistant, and the alkaline texturing liquid basically does not affect the mask layer. A main objective of texturing the second conductive region is that the textured structure can provide a larger specific surface area. Therefore, under the same deposition condition, the thickness of the second portion of the second transport layer on the second conductive region is smaller, and the thickness of the first portion of the second transport layer located on the insulation region is larger, thereby providing better insulation performance, better passivation performance, and the like.

It should be noted that the third surface on the second side of the silicon substrate 1 is exposed. While the second conductive region is textured, the third surface may also be textured. The third surface is textured after the first transport layer 2 and the barrier layer 3 are provided on the first side of the silicon substrate 1. The barrier layer 3 may exist as a mask on the remaining regions other than the second conductive region, thereby saving procedures and improving production efficiency. The texturing liquid for texturing is not specifically limited.

Step S4: Remove the mask layer on the first conductive region close to the end region of the insulation region, to expose the barrier layer below the mask layer, wet-etch away the at least a partial thickness of the barrier layer on the insulation region to expose the insulation region, and wet-etch the exposed barrier layer on the first conductive region close to the end region of the insulation region, to cause the barrier layer on the first conductive region close to the end region of the insulation region to include a second surface away from the silicon substrate and a first side surface connected to the second surface and close to the insulation region, where the first side surface extends toward the insulation region from a first end close to the second surface to a second end close to the insulation region.

The mask layer on the first conductive region close to the end region of the insulation region may be removed by using a laser, a special etching agent, or the like.

During wet-etching, at least a partial thickness of the barrier layer on the insulation region is completely etched away. For the barrier layer 3 on the first conductive region close to the end region of the insulation region, because a larger refractive index indicates a lower etching rate, during the wet-etching, in the barrier layer 3, an etching rate of a portion away from the silicon substrate 1 is higher, and an etching rate of a portion close to the silicon substrate 1 is lower. Further, the barrier layer 3 after the wet-etching includes: a second surface 31 far away from the silicon substrate 1 and a first side surface 32 connected to the second surface 31 and close to the insulation region. The first side surface 32 extends toward the insulation region from a first end close to the second surface 31 to a second end close to the insulation region.

Optionally, in the step S4, an etching solution for the wet-etching may include hydrofluoric acid or phosphoric acid. Etching by the hydrofluoric acid may be performed at room temperature, and etching by the phosphoric acid may be performed at a temperature of 158° C. or above. The foregoing etching solution has a lower etching rate for the barrier layer 3 with a larger refractive index, and has a higher etching rate for the barrier layer 3 with a smaller refractive index. Therefore, the first side surface 32 in the foregoing shape is easily formed and has low costs and little impact on other film layers of the back contact solar cell.

Optionally, the foregoing step S4 may include: first removing the mask layer on the first conductive region close to the end region of the insulation region, to expose the barrier layer 3 below the mask layer; and then performing wet-etching on both the at least a partial thickness of the barrier layer 3 on the insulation region and the barrier layer 3 exposed on the first conductive region close to the end region of the insulation region, to etch way the at least a partial thickness of the barrier layer 3 on the insulation region to expose the insulation region, and cause the barrier layer 3 on the first conductive region close to the end region of the insulation region to include a second surface 31 away from the silicon substrate 1 and a first side surface 32 connected to the second surface 31 and close to the insulation region, where the first side surface 32 extends toward the insulation region from a first end close to the second surface 31 to a second end close to the insulation region. That is, the barrier layer 3 on the insulation region and the exposed barrier layer 3 on the first conductive region close to the end region of the insulation region are etched together. Because the mask layer protects the exposed barrier layer 3 on the first conductive region close to the end region of the insulation region, due to an ablation effect of the heat affected zone at the edge of the spot of the laser and impact of the texturing liquid, the barrier layer 3 on the insulation region has a thickness less than that of the exposed barrier layer 3 on the first conductive region close to the end region of the insulation region. Therefore, in a same wet-etching environment, by controlling an etching condition and the like, it can be achieved that there is still a residue of the exposed barrier layer 3 on the first conductive region close to the end region of the insulation region while the barrier layer 3 on the insulation region has been etched completely. Moreover, because an etching rate or a refractive index of the barrier layer 3 increases or decreases in a direction from being close to the silicon substrate 1 to being away from the silicon substrate, the barrier layer on the first conductive region close to the end region of the insulation region easily forms the foregoing required morphology.

Alternatively, optionally, the foregoing step S4 may include: first performing wet-etching on the at least a partial thickness of the barrier layer 3 on the insulation region to etch away the at least a partial thickness of the barrier layer 3 on the insulation region, to expose the insulation region; and then, removing the mask layer on the first conductive region close to the end region of the insulation region, to expose the barrier layer 3 below the mask layer, and performing wet-etching on the exposed barrier layer 3 on the first conductive region close to the end region of the insulation region, to cause the barrier layer 3 on the first conductive region close to the end region of the insulation region to include a second surface 31 away from the silicon substrate 1 and a first side surface 32 connected to the second surface 31 and close to the insulation region. The first side surface 32 extends toward the insulation region from a first end close to the second surface 31 to a second end close to the insulation region. To be specific, etching is performed the barrier layer 3 on the two regions respectively. First, wet-etching is performed at least a partial thickness of the barrier layer 3 on the insulation region. During the wet-etching, the remaining mask layer protects the barrier layer 3 on the first conductive region close to the end region of the insulation region. After the at least a partial thickness of the barrier layer 3 on the insulation region is completely etched, the mask layer on the first conductive region close to the end region of the insulation region is removed. The mask layer on this region can also be removed by using a laser, a special etching agent, or the like. Then, wet-etching is performed on the barrier layer 3 on the first conductive region close to the end region of the insulation region. Because an etching rate or a refractive index of the barrier layer 3 increases or decreases in a direction from being close to the silicon substrate 1 to being away from the silicon substrate, the barrier layer on the first conductive region close to the end region of the insulation region easily forms the foregoing required morphology.

It should be noted that the barrier layer 3 on the insulation region and the exposed barrier layer 3 on the first conductive region close to the end region of the insulation region are etched together, which reduces one time of etching, but leads to a narrow process window. The barrier layer 3 on the insulation region and the barrier layer 3 on the first conductive region close to the end region of the insulation region are respectively etched, which leads to a process window is wide and is easy to implement.

Step S5: Deposit a second transport layer on the barrier layer, the insulation region, and the second conductive region.

The first side surface 32 in the foregoing shape extends toward the insulation region from a first end close to the second surface 31 to a second end close to the insulation region, so that the second transport layer 4 is deposited on a side of the barrier layer 3 away from the silicon substrate 1. The first side surface 32 of the barrier layer 3 does not affect the deposition of the second transport layer 4. Therefore, a second transport layer having good shape integrity may be formed. In particular, a first portion of the formed second transport layer 4 located in the insulation region has good shape integrity. The first portion usually has functions of blocking an electric leakage channel and passivation. Because the first portion has better shape integrity, in the back contact solar cell, a short circuit risk is lower, and a passivation effect is better, thereby improving the photoelectric conversion efficiency. In addition, because the textured structure of the second conductive region has a larger specific surface area, under the same deposition condition, the thickness of the second portion of the second transport layer 4 on the second conductive region is smaller, and the thickness of the first portion of the second transport layer located on the insulation region is larger, thereby providing better insulation performance, better passivation performance, and the like, which further improves the photoelectric conversion efficiency.

The second transport layer 4 may be deposited in a manner such as LPCVD/PECVD. A thickness of a back surface passivation layer 41 in the second transport layer 4 ranges from 3 nm to 15 nm, for example, may range from 5 nm to 8 nm, and a thickness of the doped layer 42 in the second transport layer 4 ranges from 5 nm to 25 nm, for example, may range from 10 nm to 15 nm. After the step S5, the method may further include: opening the second transport layer 4 on the first conductive region and the barrier layer 3 below the second transport layer 4 by using photography or a laser. A front surface passivation layer and a front surface anti-reflection layer are sequentially deposited on the second side of the silicon substrate 1 by using a LPCVD/PECVD device. Then, a transparent conductive layer 5 is deposited, and the transparent conductive layer 5 may be made of TCO with a thickness of 80±30 nm. The TCO may be an indium-free or low-indium material, mainly including indium tin oxide (ITO), aluminum zinc oxide (AZO), indium hydroxide-doped (IO:H), indium tungsten oxide (IWO), and the like. For example, a material of the transparent conductive layer 5 may be indium tin oxide (ITO). TCO insulation treatment is performed by using a laser ablation technology, a printing ink or photographing technology, or the like, to complete TCO insulation. The first electrode 6 and the second electrode 7 are prepared by using any one of screen printing, ink-jet printing, laser transfer printing, chemical plating, electroplating and PVD.

The present application further provides a photovoltaic module, including a plurality of back contact solar cells according to any one of the foregoing. Whether the photovoltaic module further includes another structure is not specifically limited. For example, the photovoltaic module may further include: a front packaging compound film and a cover that are sequentially located on a light-receiving side of the back contact solar cell, and a rear packaging compound film and a back sheet that are sequentially located on a back side of the back contact solar cell.

It should be noted that the preparation method for the back contact solar cell, the photovoltaic module, and the back contact solar cell may be referred to each other, and can achieve the same or similar beneficial effects as the back contact solar cell according to any one of the foregoing. To avoid repetition, details are not described herein again.

The present application is further explained below with reference to specific examples.

EXAMPLE 1

A silicon substrate 1 was an N-type, 1.3±0.3 Ωcm, 166×166 silicon wafer, and had a thickness of 150 μm.

First step: Polishing and cleaning were performed. The silicon substrate 1 entered a batch-type polishing and texturing machine. First, the silicon substrate 1 was pre-cleaned, to remove organic and other stains generated during cutting and transportation of the silicon substrate 1. The pre-cleaning may be performed by using SC1 of standard RCA cleaning. The SC1 included NH4OH, H2O2, and H2O, a volume ratio of the three was (1:1:5), and a temperature during the cleaning was 65° C. The residual chemicals in the foregoing procedure was water washed and neutralized to perform alkaline polishing. A formula for the alkaline polishing was: Damage removal and polishing preparation were performed with 5.00 wt % of KOH at 80° C. for 300 s, where a concentration of a KOH stock solution was (45%). Subsequently, high-efficient SC1 cleaning was performed at 65° C. for 300 s, where a volume ratio of NH4OH to H2O2 to H2O was (1:1:5). Metal residual removal cleaning was performed with SC2 (in SC2, a volume ratio of HCL to H2O2 to H2O was 1:1:5, a temperature was 65° C., and a cleaning time was 200 s), and finally, cleaning was performed with 5 wt % of hydrofluoric acid, to complete preparation of a polished wafer. A first surface on the first side of the silicon substrate 1 included a first conductive region, a second conductive region, and an insulation region located between the first conductive region and the second conductive region.

Second step: A 7 nm back surface passivation layer 21 and a 25 nm doped layer 21 were deposited on the first surface on the first side of the silicon substrate 1 at a temperature of 240° C. by using a PECVD device. Subsequently, a first layer of SiNx having a thickness of 40 nm and a refractive index of 2.5, a second layer of SiNx having a thickness of 40 nm and a refractive index of 2.3, and a third layer of SiNx having a thickness of 40 nm and a refractive index of 2.0 were sequentially deposited, where the first layer of SiNx, the second layer of SiNx, and the third layer of SiNx formed a barrier layer 3. At last, a 20 mm acid-resistant and alkali-resistant mask layer A was then deposited. The mask layer A may be made of polyurethane or the like.

Third step: Laser film opening was performed by using a green nanosecond laser, a spot of the laser vaporized and ablated the barrier layer 3, that is, SiNx and the mask layer A, on the second conductive region to perform film opening, and at the same time, a heat affected zone at an edge of the spot of the laser ablated the mask layer A located on the insulation region and a partial thickness of the barrier layer 3 below the mask layer A, to cause the partial thickness of the barrier layer 3 to still remain on the insulation region.

Fourth step: A post-texturing cleaning solution was performed. First sub-step: Residual SiNx on the second conductive region opened by the laser was cleaned by using 1 wt % of hydrofluoric acid for 120 s to expose the first transport layer on the second conductive region. Second sub-step: Texturing cleaning: A TS53V01:KOH:DIW system was used, where a concentration of TS53V01 ranged from of 0.2 wt % to 1.5 wt %, a concentration of KOH ranged from 1 wt % to 3 wt %, and a temperature ranged from 75° C. to 85° C. For example, the concentration of the TS53V01 ranged from 0.5 wt % to 1 wt %, and the concentration of the KOH ranged from 1.5 wt % to 2 wt %. During the texturing cleaning, the first transport layer on the second conductive region was cleaned away by using a texturing liquid, to expose the second conductive region, so that the texturing liquid textured the second conductive region. Third sub-step: Efficient SC1 cleaning was performed at 65° C. for 300 s, where a volume ratio of KOH to H2O2 to H2O was (2:1:5). Metal residual removal cleaning was performed with SC2 (a use volume ratio HCL to H2O2 to H2O of the SC2 was 1:1:5, a temperature was 65° C., and a cleaning time was 200 s). Subsequently, a partial thickness of the barrier layer 3, namely, a SiNx side surface, on the insulation region was etched by using 4% of HF, to completely etch away the barrier layer on the insulation region. Further, the remaining mask layer A was removed by using an etching agent, and then the third layer of SiNx on the first conductive region was removed by using 4% of HF. The first layer of SiNx and the second layer of SiNx formed a gradual slope morphology as the etched barrier layer 3, so that the second transport layer 4 can form a step shape formed by connecting a third portion, a first sub-portion, and a second sub-portion sequentially. A dimension or width of the first sub-portion in a direction parallel to the first conductive region and along a distribution direction L7 of the first conductive region and the insulation region was 1 μm. Finally, the etched barrier layer 3 was slowly pulled and dried, to obtain the structure shown in FIG. 2.

Fifth step: A 5 nm back surface passivation layer 41 and a 15 nm doped layer 42 were deposited on the first side of the silicon substrate 1 at a temperature of 185° C. by using a PECVD device.

Sixth step: Laser film opening was performed by using a green nanosecond laser, to open the second transport layer 4 on the first conductive region.

Seventh step: The exposed barrier layer 3, namely, the SiNx layer, was cleaned. The exposed SiNx layer was completely removed by using 4 wt % of a hydrofluoric acid solution for 450 s. Then, the silicon substrate 1 was efficiently cleaned. Optionally, standard RCA cleaning, namely, SC1 cleaning, was used at 65° C. for 300 s, where a volume ratio of NH4OH to H2O2 to H2O was (1:1:5), SC2 metal residue removal cleaning (a use volume ratio of HCL:H2O2:H2O of SC2 was 1:1:5, a temperature was 65° C., and a cleaning time was 200 s) was performed. Finally, after cleaning was performed with 4 wt % of hydrofluoric acid, the silicon substrate 1 had textured of the third surface and an oxide layer on a patterned region on the second conductive region removed and was made water-repellent.

Eighth step: Hydrogenated amorphous silicon and silicon nitride anti-reflection films were deposited on the front surface. By using a PECVD device, 10 nm hydrogenated amorphous silicon was deposited at 200° C. as a front surface passivation layer, and an 80 nm SiNx anti-reflection film with a 2.1 refractive index was deposited as a front surface anti-reflection layer.

Ninth step: A transparent conductive layer 5 was deposited, where indium tin oxide (ITO) with a thickness of 50 nm was deposited.

Tenth step: Insulation was performed between the first transport layer 2 and the second transport layer 4, and the transparent conductive layer 5 was insulated through laser film opening. That is, the transparent conductive layer 5 was partially ablated away, to prevent electric leakage caused by interconnection between the first transport layer 2 and the second transport layer 4. After being opened by an ultraviolet picosecond laser, the insulation region had an insulation resistance tested to be greater than 2 MΩ, where a width of the laser was 100 μm.

Eleventh step: An electrode was prepared. Preparation of a back surface metallized electrode was completed by using a screen printing technology.

The back contact solar cell prepared in Example 1 is shown in FIG. 2.

Table 1 shows a distribution table of chemicals used in tanks during wet cleaning of Example 1 and corresponding functions. Referring to Table 1, there may be 12 tanks for wet cleaning in Example 1. All the tanks are numbered from 1 to 12. Each tank corresponds to a small step. Chemicals used in each tank and their functions are recorded below a number corresponding to the tank.

TABLE 1

Distribution of chemicals used in tanks during wet cleaning of Example 1 and corresponding functions

| | Tank number | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Function | Removing residual $SiN_x$ on a laser-opened region | DIW | Pre-cleaning | DIW | Removing a first transport layer in a second conductive region, and performing texturing | DIW | SC1 | DIW | SC2 | DIW | Removing an oxide layer | Slow pulling |
| Chemical | HF | | $KOH/H_2O_2$ | | HTS53V01:KOH: DIW system | | KOH—$H_2O_2$—$H_2O$ | | HCL:$H_2O_2$:$H_2O$ | | HF | |

EXAMPLE 2

Example 2 slightly differed from Example 1 only in the third step, and the remaining steps were correspondingly the same. An area of a heat affected zone at an edge of the spot of the laser in the third step of Example 2 was smaller than an area of a heat affected zone at an edge of the spot of the laser in the third step of Example 1. In Example 2, a structure of the first portion shown in FIG. 1 was formed. A back contact solar cell prepared in Example 2 is shown in FIG. 1.

EXAMPLE 3

Example 3 slightly differed from Example 1 only in the second step, and the remaining steps were correspondingly the same.

Second step: A 7 nm back surface passivation layer 21 and a 25 nm doped layer 21 were deposited on the first surface on the first side of the silicon substrate at a temperature of 240° C. by using a PECVD device. Subsequently, a single-layer structured silicon nitride film layer having a gradient refractive index was disposed, where a content of N gradually increased in three time periods. NH3 was introduced in a first time period at 50 SCCM, NH3 was introduced in a second time period at 100 SCCM, and NH3 was introduced in a third time period at 150 SCCM. A total of 90 nm of the silicon nitride film layer was deposited. A duration of the first time period, a duration of the second time period, and a duration of the third time period may be equal and range from 10 minutes to 30 minutes.

The back contact solar cell prepared in Example 3 is shown in FIG. 2.

Comparative Example 1

First step: Polishing and cleaning. The first step in Comparative example 1 is correspondingly the same as the first step in Example 1.

Second step: A mask was produced on the first side of the silicon substrate, the second side of the silicon substrate was textured, and the mask on the first side was removed.

Third step: A 7 nm back surface passivation layer 21 and a 25 nm doped layer 21 were deposited on the first surface on the first side of the silicon substrate at a temperature of 240° C. by using a PECVD device. Subsequently, a SiNx layer having a thickness of 120 nm, a refractive index of 2.2, and uniform reflectivity was obtained through deposition as a barrier layer.

Fourth step: Laser film opening was performed by using a green nanosecond laser, to vaporize and ablate the barrier layer 3 for film opening.

Fifth step: Residual SiNx on the laser-opened region was cleaned by using 1 wt % of hydrofluoric acid for 120 s, the exposed first transport layer was removed by using an alkaline solution, and finally, slow pulling and drying were performed.

The subsequent steps in Comparative example 1 were correspondingly the same as the fifth step to the eleventh step in Example 1.

Comparative Example 2

Comparative example 2 differed from Comparative example 1 only in the third step, and the remaining steps were correspondingly the same.

Third step: A 7 nm back surface passivation layer 21 and a 25 nm doped layer 21 were deposited on the first surface on the first side of the silicon substrate at a temperature of 240° C. by using a PECVD device. Subsequently, a SiNx layer having a thickness of 120 nm, a refractive index of 2.3, and uniform reflectivity was obtained through deposition as a barrier layer.

Comparative Example 3

Comparative example 3 differed from Comparative example 1 only in the third step, and the remaining steps were correspondingly the same.

Third step: A 7 nm back surface passivation layer 21 and a 25 nm doped layer 21 were deposited on the first surface on the first side of the silicon substrate at a temperature of 240° C. by using a PECVD device. Subsequently, a SiNx layer having a thickness of 90 nm, a refractive index of 2.1, and uniform reflectivity was obtained through deposition as a barrier layer.

Performance tests were performed on the back contact solar cells respectively formed in the examples and the comparative examples under same test conditions. For test results, reference may be made to the following Table 2.

TABLE 2

Performance comparison table of back contact solar cells formed in examples and comparative examples

| | Jsc ($A/cm^2$) | Voc (V) | FF (%) | Eff (%) | Rs (Ω) | Rsh_D (Ω) | IVRV2 (A) |
|---|---|---|---|---|---|---|---|
| Example 1 | 41.66 | 0.7443 | 80.77 | 25.045 | 0.0028 | 158 | 0.26 |
| Example 2 | 41.79 | 0.7429 | 80.57 | 25.014 | 0.0021 | 107 | 0.35 |
| Example 3 | 41.64 | 0.7438 | 80.33 | 25.880 | 0.0034 | 198 | 0.21 |
| Comparative example 1 | 41.61 | 0.7402 | 80.05 | 24.655 | 0.003 | 36 | 0.78 |
| Comparative Example 2 | 41.59 | 0.7412 | 79.15 | 24.399 | 0.0029 | 44 | 0.81 |
| Comparative Example 3 | 41.63 | 0.7392 | 79.91 | 24.590 | 0.0038 | 42 | 0.90 |

In Table 1, Jsc represents a short-circuit current density of a back contact solar cell, Voc represents an open-circuit voltage of the back contact solar cell, FF represents a fill factor of the back contact solar cell, Eff represents photoelectric conversion efficiency of the back contact solar cell, Rs represents a series resistance of the back contact solar cell, Rsh_D represents a parallel resistance of the back contact solar cell, and IVRV2 represents a reverse current of the back contact solar cell. It can be learned from the foregoing Table 1 that, compared with Comparative example 1 to Comparative example 3, parallel resistances of the back contact solar cells in Example 1 to Example 3 are all very large, and reverse currents of the back contact solar cells in Example 1 to Example 3 are all very small. Therefore, insulation resistance values of the back contact solar cells in Example 1 to Example 3 are larger, and insulation effects are better. In addition, compared with Comparative example 1 to Comparative example 3, short-circuit current densities, open-circuit voltages, fill factors, and photoelectric conversion efficiency of the back contact solar cells in Example 1 to Example 3 are all larger, and electrical performance of the back contact solar cells in Example 1 to Example 3 was better. A main reason is that in Example 1 to Example 3, the barrier layer 3 includes a second surface 31 away from the silicon substrate 1 and a first side surface 32 connected to the second surface 31 and close to the insulation region. The first side surface 32 extends toward the insulation region from a first end close to the second surface 31 to a second end close to the insulation region. The first side surface 32 does not have a portion that is concave toward the first conductive region, so that the first side surface 32 facilitates deposition of the second transport layer 4, and in particular, facilitates deposition of a portion of the second transport layer 4 located on the first side surface 32. The formed second transport layer 4 has better shape integrity, thereby improving various performance of the back contact solar cell. The second conductive region has a textured structure, and textured structure has a larger specific surface area. Therefore, under the same deposition condition, in the second transport layer 4, the thickness of the first portion located on the insulation region is greater than the thickness of the second portion located on the second conductive region. In addition, in the second transport layer 4, the first portion located on the insulation region further has specific passivation performance and insulation performance. The thickness of the first portion is greater than the thickness of the second portion, which can improve the passivation performance and insulation performance of the back contact solar cell.

It should be noted that for ease of description, the method embodiments are all described as a series of action combinations. However, a person skilled in the art should learn that the embodiments of the present application are not limited to the described order of the actions because some steps may be performed in another order or performed at the same time according to the embodiments of the present application. In addition, a person skilled in the art should also learn that the embodiments described in the specification are all preferred embodiments, and the actions involved are not all necessarily required by the embodiments of the present application.

It should be noted that terms “include”, “comprise”, and any variants thereof are intended to cover a non-exclusive inclusion. Therefore, in the context of a process, method, object, or apparatus that includes a series of elements, the process, method, object, or apparatus not only includes such elements, but also includes other elements not specified expressly, or may include inherent elements of the process, method, object, or device. Without more limitations, elements defined by a sentence “including one” does not exclude that there are still other same elements in the process, method, object, or apparatus.

Through the descriptions of the foregoing implementations, a person skilled in the art may clearly understand that the method according to the foregoing embodiments may be implemented through software and a necessary general hardware platform, and certainly, may also be implemented by hardware, but in many cases, the former manner is a better implementation. Based on such an understanding, the technical solutions of the present application essentially, or the part contributing to the related art, may be presented in the form of a software product. The computer software product is stored in a storage medium (for example, a ROM/RAM, a magnetic disk, or an optical disc) including a plurality of instructions to enable a terminal (which may be a mobile phone, a computer, a server, an air conditioner, a network device, or the like) to perform the methods described in the embodiments of the present application.

The embodiments of the present application are described above with reference to the accompanying drawings. However, the present application is not limited to the foregoing specific implementations. The foregoing specific implementations are illustrative instead of limitative. Enlightened by the present application, a person of ordinary skill in the art can make many forms without departing from the idea of the present application and the scope of protection of the claims. All of the forms fall within the protection of the present application.

What is claimed is:

1. A back contact solar cell, comprising:

a silicon substrate, having a first surface, wherein the first surface comprises a first conductive region, a second conductive region, and an insulation region located between the first conductive region and the second conductive region, wherein the first surface is provided with a groove, wherein the second conductive region corresponds to a bottom of the groove that has a textured structure, and wherein the insulation region corresponds to a side surface of the groove;

a first transport layer located on the first conductive region; and a second transport layer located on the second conductive region, wherein the second transport layer extends from the second conductive region through the insulation region to the first conductive region, and partially covers the first transport layer, wherein a thickness of a portion of the second transport layer located on the insulation region is greater than a thickness of a portion of the second transport layer located on the second conductive region, and wherein a thickness of a portion of the second transport layer located on the first conductive region is 1.2 to 2 times a thickness of a portion of the second transport layer located on the textured structure.

2. The back contact solar cell according to claim 1, wherein the insulation region further comprises a platform located between the first conductive region and the groove.

3. The back contact solar cell according to claim 2, wherein the platform has a polished structure.

4. The back contact solar cell according to claim 2, wherein a thickness of the second transport layer located on the platform is greater than a thickness of the second transport layer located on the side surface of the groove.

5. The back contact solar cell according to claim 2, wherein the first conductive region is parallel to the platform.

6. The back contact solar cell according to claim 2, wherein the side surface of the groove is inclined relative to the platform, and a cross-sectional area of the groove decreases along a direction from an opening of the groove to the bottom of the groove.

7. The back contact solar cell according to claim 2, wherein a portion of the side surface of the groove proximate to the first conductive region has a polished surface structure.

8. The back contact solar cell according to claim 1, wherein the second transport layer comprises a back surface passivation layer and a doped layer, wherein the back surface passivation layer is closer to the silicon substrate than the doped layer, and wherein a thickness of a portion of the back surface passivation layer located on the first conductive region is 1.2 to 2 times a thickness of a portion of the back surface passivation layer located on the textured structure.

9. The back contact solar cell according to claim 6, wherein the side surface of the groove and the first surface of the silicon substrate form an acute angle.

10. The back contact solar cell according to claim 2, wherein a length of the platform on two sides of the groove along an extension direction of the groove is less than or equal to 10 microns.

11. The back contact solar cell according to claim 1, wherein:

the first transport layer comprises a first back surface passivation layer and a first doped layer stacked in sequence, wherein the first back surface passivation layer is closer to the silicon substrate than the first doped layer, the first doped layer comprises doped polysilicon, and the first back surface passivation layer comprises tunneling silicon oxide; and the second transport layer comprises a second back surface passivation layer and a second doped layer stacked in sequence, wherein the second back surface passivation layer is closer to the silicon substrate than the second doped layer, the second doped layer comprises doped microcrystalline silicon, and the second back surface passivation layer comprises intrinsic amorphous silicon.

* * * * *